United States Patent [19]

Chiron et al.

[11] Patent Number: 4,649,349
[45] Date of Patent: Mar. 10, 1987

[54] DEVICE FOR AUTOMATICALLY COMPENSATING THE MAGNETISM OF DRILL STRING MEMBERS

[75] Inventors: Guy Chiron, Gieres; Jean-Charles Vidal, Meylan, both of France

[73] Assignee: Commissariat a l'Energie Atomique, Paris, France

[21] Appl. No.: 585,183

[22] Filed: Mar. 1, 1984

[30] Foreign Application Priority Data

Mar. 11, 1983 [FR] France ............................. 83 04036

[51] Int. Cl.⁴ .................... G01V 3/26; G01R 33/025; E21B 47/022
[52] U.S. Cl. .................................. 324/346; 324/244; 175/45; 33/313
[58] Field of Search ............... 324/338, 339, 345, 346, 324/366, 369, 244; 33/313; 175/45

[56] References Cited

U.S. PATENT DOCUMENTS

| | | | |
|---|---|---|---|
| 3,311,821 | 3/1967 | Brunel | 324/244 |
| 4,163,324 | 8/1979 | Russell et al. | 33/313 |
| 4,463,314 | 7/1984 | Wilson | 324/244 |
| 4,529,939 | 7/1985 | Kuckes | 324/346 |

FOREIGN PATENT DOCUMENTS 2060261 6/1971 France.
2070105 9/1981 United Kingdom.

*Primary Examiner*—Ernest F. Karlsen
*Assistant Examiner*—Walter E. Snow
*Attorney, Agent, or Firm*—James E. Nilles; Nicholas A. Kees

[57] ABSTRACT

Each end of the rods surrounding the positioning sensor is provided with a coil, through which passes a current, whose intensity is automatically regulated as a function of the sensor readings in order to make the gradient of the magnetic field due to the rods and to the field itself zero within the sensor area.

3 Claims, 4 Drawing Figures

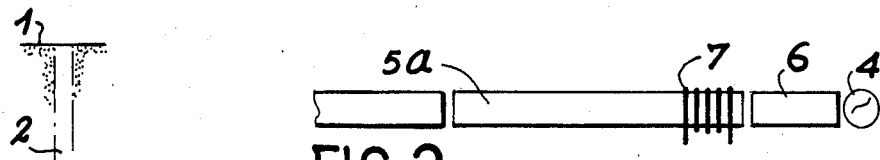
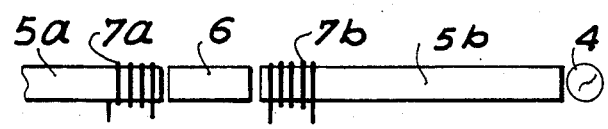
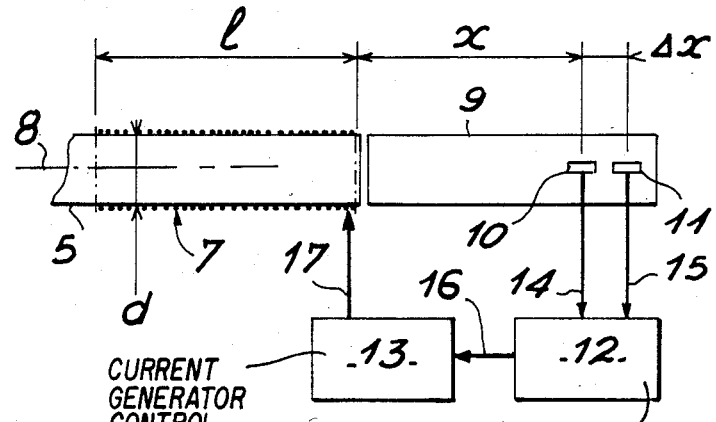
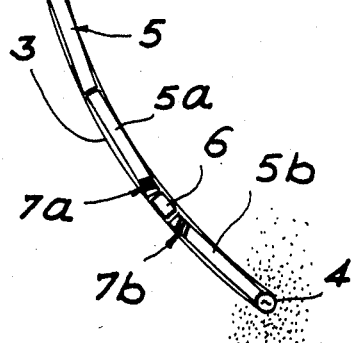
FIG.2
FIG.3
FIG.4
CURRENT GENERATOR CONTROL
DIFFERENTIAL AMPLIFIER
FIG.1

4,649,349

DEVICE FOR AUTOMATICALLY COMPENSATING THE MAGNETISM OF DRILL STRING MEMBERS

BACKGROUND OF THE INVENTION

The present invention relates to techniques for drilling wells or shafts in the subsoil and more particularly to the case where the drilling cavity must at least partly be formed of zones having a certain curvature.

In this special case, it is sometimes necessary to guide the drilling tool into the curved zones by using markings obtained with the aid of magnetic measurements with respect to the direction and intensity of the geomagnetic field. When drilling takes place in highly curved areas, it is conventional practice to use drill strings comprising members in the form of solid or hollow cylindrical bars having e.g. a length of 20 to 50 m, for advancing the cutting tool into the drilling cavity. Unfortunately, the motor of the tool, as well as the drill string members used for advancing it are generally made from highly ferromagnetic materials, such as iron or ordinary steel, and consequently have a significant magnetization. This magnetization has the serious defect of interfering with the ambient magnetic field and consequently of falsifying the readings of the positioning sensor with respect to the geomagnetic field if said sensor is positioned in the vicinity of the drill string members as is necessary in practice.

Hitherto the solution adapted to overcome this problem has consisted of using non-magnetic stainless steel for making the drill string members closest to the positioning sensor. Unfortunately, this metal is very expensive so that this solution is not ideal.

SUMMARY OF THE INVENTION

The object of the present invention is a device for automatically compensating the magnetism of drill string members, thus making it possible to compensate the harmful magnetic effect of these members at the very magnetic field sensors which control the positioning of the drilling tool by using easily and inexpensively produced means.

This object is achieved by a device for automatically compensating the magnetism of drill string members of the type formed by solid or hollow, cylindrical, magnetic material bars, for advancing by gravity the drilling tool, which is guided in its advance by the readings of a positioning sensor relative to the geomagnetic field, wherein each end of the drill string members surrounding the positioning sensor is provided with a coil, through which passes a current, whose intensity is automatically regulated, as a function of the sensor readings, in order to make the gradient of the magnetic field due to the drill string members zero, within the area of the sensor.

Thus, the device according to the invention, which only uses a short coil placed at the ends of the two drill string members closest to the sensor, makes it possible to magnetise in the opposite direction to the magnetization induced by the geomagnetic field, that part of the material constituting the drill string members, in such a way that, in the vicinity of the said ends, there is an area where the magnetic field gradient due to the members is zero. Moreover, if care is also taken in choosing the length of the coil, the position of the field measuring point, i.e. that of the sensor relative to the drill string members, and the intensity of the current passing through the coil, it is also possible to easily ensure that the interference field is zero at the point where the positioning sensor is located. Thus, the magnetic field due to the drill string members, and the gradient of said field are zero in the area of the sensor.

According to an interesting variant of the present invention, the positioning sensor comprises, in a hollow, cylindrical, amagnetic material sleeve, two magnetic probes located at a distance x from the end of a drill string member and at a distance Δx from one another, a differential amplifier determining the difference in the readings supplied by the two probes and controlling with the aid of said difference a current generator, which regulates the intensity passing through the coil to a value such that the gradient of the magnetic field due to the members and the actual field is zero at distance x from said member.

Thus, according to the invention, use is made of the magnetic field gradient between two adjacent magnetic probes to automatically regulate the current flowing through the coil so that, by design, the interference field is made zero at this point. Once this result has been achieved, it is certain that the readings of the drilling tool positioning sensor are no longer interfered with compared with the geomagnetic field and use can be made thereof for controlling the advance of the drilling tool in the desired direction for the cavity.

BRIEF DESCRIPTION OF THE DRAWINGS

The invention is described in greater detail hereinafter relative to non-limitative embodiments of the automatic compensating device and with reference to the attached FIGS. 1 to 4, wherein show:

FIG. 1 diagrammatically in a drilling well having a certain curvature, the position of the drill rods surrounding the magnetic positioning sensor and advancing the drilling equipment.

FIG. 2 very diagrammatically, the automatic compensating device according to the invention in the case where it is placed at the end of the final rod preceding the drilling tool.

FIG. 3 diagrammatically the automatic compensating device according to the invention in the case where it is positioned at the two ends of two adjacent rods surrounding the magnetic positioning sensor.

FIG. 4 in greater detail, the embodiment of FIG. 2.

DETAILED DESCRIPTION OF THE PREFERRED EMBODIMENTS

FIG. 1 shows the ground surface 1 and the drilling well or shaft 2, which acquires a certain curvature over the path 3. Drilling well 2 contains the drilling tool 4, which can e.g. be a drilling bit or some equivalent tool. As explained hereinbefore, the tool 4 is preceded in the drilling shaft 2 by a certain number of drill string members, hereinafter sometimes referred to as drill rods 5 (in this case three rods), which are in fact ordinary magnetic steel or iron hollow or solid bars having a length of 20 to 50 m and a diameter of approximately 20 cm, permitting their passage in a manner compatible with the curvature of region 3 of the drilling well. The object of these drill rods, which have a considerable weight, is to bear on the drilling tool 4 whilst advancing it by gravity. The positioning sensor 6 is positioned between rods 5a and 5b, which makes it possible to orient the advance of tool 4 by providing a spatial marking relative to the geomagnetic field direction at the point where it is positioned. According to the invention, the ends of drill rods 5a and 5b adjacent to the positioning sensor are in each case provided with a coil 7a, 7b respectively, through which passes a current, whose intensity is automatically regulated as a function of the readings of sensor 6, so as to make zero in the region of said sensor both the magnetic field due to the rods and its gradients. Therefore, it is ensured that the positioning sensor undergoes no interference in its marking relative to the geomagnetic field as a result of the adjacent drill rods 5a, 5b. A more detailed explanation is given hereinafter with reference to FIG. 4 of the way in which the positioning sensor 6 regulates the currents flowing through coil 7a, 7b in order to achieve this result.

FIG. 2 shows an embodiment of the device according to the invention, in which the positioning sensor 6 is placed directly between the drilling tool 4 and the adjacent drill rod 5a. In this particular case, a single coil 7 is provided at the end of rod 5a in the vicinity of sensor 6.

FIG. 3 shows another embodiment corresponding to that of FIG. 1, in which sensor 6 is inserted between adjacent rods 5a, 5b, the drilling tool 4 being at the top of the device, at the end of rod 5b, that is remote from its coil. The two coils 7a, 7b of FIG. 1 are once again present here.

FIG. 4 shows in greater detail the diagram of an automatic compensating device according to the invention, which, along the drilling axis 8, has the end of a drill rod 5, a coil 7 and a hollow cylindrical sleeve 9 made from amagnetic material and which contains the two local magnetic field detecting probes 10, 11. Probe 10 is at a distance X from the nearest end of rod 5, and the distance between probes 10 and 11 is ΔX. In order to further define the reciprocal magnitudes of the elements present, reference will be made to an example in which the drill rod 5 has a diameter of 20 cm, coil 7 a diameter of 25 cm, and in which the distance x is 55 cm for a coil 7 of length of 80 cm. In this example, the second sensor 11 is located at a distance of 5 cm from the first sensor 10, which means that the average value for the ratio Δx/x is approximately 1/10. The reciprocal positioning of the two probes 10 and 11 is ensured by the hollow amagnetic material tube 9, which has the same function as the non-magnetic rod conventionally used according to the prior art for removing the positioning sensor from the magnetic field produced by the drill rods 5. However, in the present case it is much shorter, its length being e.g. approximately 1 m instead of 20 m, which is the usual length with such rods. Its length is in fact dependent on the dimension x separating the first sensor 10 from the end of rod 5, which is itself a function of the length 1 of coil 7. The drilling tool is not shown in FIG. 4.

The hollow cylindrical sleeve 9 also contains the differential amplifier 12 and the current generator control 13 which, for reasons of clarity in the drawing, are shown outside sleeve 9. By means of the two connections 14 and 15, differential amplifier 12 receives the respective readings of sensors 10 and 11, and determines their difference, which it amplifies. This difference is then transmitted by line 16 to the current generator control 13, which supplies the turns of coil 7 via conductor 17. Thus, the differential amplifier 12 behaves in the same way as a zero detector, i.e. it stabilizes the current supplied by generator 13 to the coil 7 to a constant value as soon as the readings received on lines 14 and 15 are the same. Probe then supplies the axial value of the geomagnetic field, which has been made strictly independent of any magnetic influence due to the drill rods 5 or the drilling tool.

The energy source necessary for the operation of the system can be either a battery or an accumulator located inside the hollow cylindrical sleeve 9 or even outside the drilling system.

What is claimed is:

1. Apparatus comprising a positioning sensor for use with an earth drilling tool attached to a front end of a drill string that comprises a plurality of elongated drill string members connected end-to-end, said positioning sensor being carried by said drill string near the front end thereof and being responsive to the earth's magnetic field to produce outputs useful for controlling the direction of advance of the drilling tool, said apparatus being characterized by:
   A. a sleeve of nonmagnetic material connected in the drill string adjacent to one end of one of said drill string members and near the drilling tool;
   B. said positioning sensor comprising a pair of probes fixed coaxially in said sleeve and spaced apart in the direction lengthwise of the drill string by a distance substantially smaller than the distance between the probes and said one end of said one drill string member, each said probe being adapted to produce an electrical output which is dependent upon the magnetic field in its immediate vicinity;
   C. a coil around said one drill string member, adjacent to said one end thereof, through which a current can be passed to produce a compensating magnetic field that opposes and nullifies the magnetic field due to existing magnetization of the drill string members and the drilling tool;
   D. a differential amplifier connected with both of said probes for producing a control output dependent upon the difference between said electrical outputs of the two probes; and
   E. control means connected with said differential amplifier and with said coil and arranged to energize said coil with a current which is so varied as to maintain a substantially zero differece between the electrical outputs of the two probes so that the electrical output of each probe is dependent substantially only upon the earth's magnetic field in its vicinity.

2. The apparatus of claim 1, further characterized in that said distance between the two probes is on the order of one-tenth of said distance between the probes and said one end of said one drill string member.

3. The apparatus of claim 2 wherein said one end of said one drill string member is a front end thereof and said sleeve is connected between that front end and a rear end of another drill string member, further characterized by: a second coil which surrounds said other drill string member adjacent to said rear end thereof and which is connected with said control means for cooperation with the first mentioned coil in producing said compensating magnetic field.

* * * * *